(12) United States Patent
Darling et al.

(10) Patent No.: US 10,954,139 B2
(45) Date of Patent: Mar. 23, 2021

(54) OLEOPHILIC FOAMS FOR OIL SPILL MITIGATION

(71) Applicant: UCHICAGO ARGONNE, LLC, Chicago, IL (US)

(72) Inventors: Seth B. Darling, Chicago, IL (US); Jeffrey W. Elam, Elmhurst, IL (US); Anil U. Mane, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 16/599,537

(22) Filed: Oct. 11, 2019

(65) Prior Publication Data
US 2020/0039845 A1    Feb. 6, 2020

Related U.S. Application Data

(62) Division of application No. 14/967,021, filed on Dec. 11, 2015, now Pat. No. 10,550,010.

(51) Int. Cl.
*B01J 20/24* (2006.01)
*C02F 1/28* (2006.01)
(Continued)

(52) U.S. Cl.
CPC .......... *C02F 1/288* (2013.01); *B01D 15/265* (2013.01); *B01J 20/223* (2013.01); *B01J 20/262* (2013.01);
(Continued)

(58) Field of Classification Search
CPC ............ C02F 1/288; C02F 2101/32; C02F 2103/007; C02F 2103/08; C02F 2201/008;
(Continued)

(56) References Cited

U.S. PATENT DOCUMENTS

| 3,617,552 A | 11/1971 | Will et al. |
| 4,744,889 A | 5/1988 | Kruyer |

(Continued)

FOREIGN PATENT DOCUMENTS

| WO | WO-2006/033924 | 3/2006 |
| WO | WO-2011/138583 A1 | 11/2011 |

OTHER PUBLICATIONS

Wang et al., "Extremely Efficient and Recyclable Absorbents for Oily Pollutants Enabled by Ultrathin-Layered Functionalization," Applied Materials and Interfaces, 2014, 6, 18816-18823. (Year: 2014).*

(Continued)

*Primary Examiner* — Kara B Boyle
(74) *Attorney, Agent, or Firm* — Foley & Lardner LLP

(57) ABSTRACT

A method of fabricating an oleophilic foam includes providing a foam comprising a base material. The base material is coated with an inorganic material using at least one of an atomic layer deposition (ALD), a molecular layer deposition (MLD) or sequential infiltration synthesis (SIS) process. The SIS process includes at least one cycle of exposing the foam to a first metal precursor for a first predetermined time and a first partial pressure. The first metal precursor infiltrates at least a portion of the base material and binds with the base material. The foam is exposed to a second co-reactant precursor for a second predetermined time and a second partial pressure. The second co-reactant precursor reacts with the first metal precursor, thereby forming the inorganic material on the base material. The inorganic material infiltrating at least the portion of the base material. The inorganic material is functionalized with an oleophilic material.

14 Claims, 6 Drawing Sheets

(51) Int. Cl.

| | |
|---|---|
| *C23C 16/40* | (2006.01) |
| *B01D 15/26* | (2006.01) |
| *B01J 20/26* | (2006.01) |
| *B01J 20/22* | (2006.01) |
| *B01J 20/28* | (2006.01) |
| *B01J 20/32* | (2006.01) |
| *C23C 16/04* | (2006.01) |
| *C23C 16/455* | (2006.01) |
| *C02F 101/32* | (2006.01) |
| *C02F 103/00* | (2006.01) |
| *C02F 103/08* | (2006.01) |

(52) U.S. Cl.
CPC ..... *B01J 20/28045* (2013.01); *B01J 20/3212* (2013.01); *B01J 20/3217* (2013.01); *B01J 20/3236* (2013.01); *B01J 20/3285* (2013.01); *B01J 20/3291* (2013.01); *C23C 16/045* (2013.01); *C23C 16/403* (2013.01); *C23C 16/45555* (2013.01); *C02F 2101/32* (2013.01); *C02F 2103/007* (2013.01); *C02F 2103/08* (2013.01); *C02F 2201/008* (2013.01)

(58) Field of Classification Search
CPC ............ C23C 16/045; C23C 16/45555; C23C 16/403; B01D 15/265; B01J 20/262; B01J 2/223; B01J 20/28045; B01J 20/3291; B01J 20/3236; B01J 20/3285; B01J 20/3217; B01J 20/3212

See application file for complete search history.

(56) References Cited

U.S. PATENT DOCUMENTS

| | | | |
|---|---|---|---|
| 4,889,542 | A | 12/1989 | Hayes |
| 5,133,881 | A | 7/1992 | Miller et al. |
| 5,645,733 | A | 7/1997 | Hobson |
| 6,326,326 | B1 | 12/2001 | Feng et al. |
| 6,723,595 | B2 | 4/2004 | Park |
| 8,980,418 | B2 | 3/2015 | Darling et al. |
| 9,103,086 | B2 | 8/2015 | Cantrell et al. |
| 9,719,226 | B2 * | 8/2017 | Riedel ............... E02B 15/06 |
| 2002/0005360 | A1 | 1/2002 | Haug et al. |
| 2003/0082412 | A1 | 5/2003 | Fukuda et al. |
| 2005/0081907 | A1 | 4/2005 | Lewis et al. |
| 2006/0048938 | A1 * | 3/2006 | Kalman ............... E21B 43/267 166/278 |
| 2006/0088666 | A1 | 4/2006 | Kobrin et al. |
| 2008/0107809 | A1 | 5/2008 | Wu et al. |
| 2008/0286448 | A1 | 11/2008 | Elam et al. |
| 2009/0111703 | A1 | 4/2009 | Gopalan |
| 2009/0304920 | A1 | 12/2009 | Elam et al. |
| 2010/0003406 | A1 | 1/2010 | Lam et al. |
| 2010/0080903 | A1 | 4/2010 | Tamitsuji et al. |
| 2011/0042301 | A1 | 2/2011 | Zhang et al. |
| 2011/0056886 | A1 | 3/2011 | De Luca |
| 2011/0168454 | A1 | 7/2011 | Keshavan et al. |
| 2012/0046421 | A1 | 2/2012 | Darling et al. |
| 2012/0171403 | A1 | 7/2012 | Dodge |
| 2013/0059123 | A1 | 3/2013 | Wang et al. |
| 2013/0095996 | A1 | 4/2013 | Buelow et al. |
| 2014/0370259 | A1 | 12/2014 | Edwards et al. |
| 2014/0371060 | A1 * | 12/2014 | Smith ............... B01J 20/3064 502/402 |
| 2017/0025658 | A1 | 1/2017 | Shi et al. |

OTHER PUBLICATIONS

Bico, et al., "Wetting of textured surfaces," Colloids and Surfaces A: Physicochemical and Engineering Aspects 206(1-3), pp. 41-46 (2002).

Bobji, et al., "Underwater sustainability of the 'Cassie' state of wetting," Langmuir 25(20), pp. 12120-12126 (2009).

Buluswar, et al., "50 Breakthroughs: Critical scientific and technological advances needed for sustainable global development," Institute for Transformative Technologies, Lawrence Berkeley National Lab., 22 pages (2014).

Calcagnile, et al., "Magnetically Driven Floating Foams for the Removal of Oil Contaminants from Water," ACS Nano 6(6), pp. 5413-5419 (2012).

Cao, et al., "Hydrophobic/Hydrophilic Cooperative Janus System for Enhancement of Fog Collection," Small 11(34), pp. 4379-4384 (2015).

Chen & Xu, "Mineral-Coated Polymer Membranes with Superhydrophilicity and Underwater Superoleophobicity for Effective Oil/Water Separation," Scientific Reports 3, 2776, 6 pages (2013).

Chen, et al., "Bio-inspired $CaCO_3$ coating for superhydrophilic hybrid membranes with high water permeability," Journal of Materials Chemistry 22, pp. 22727-22733 (2012).

Chen, et al., "Enhancing the hydrophilicity and water permeability of polypropylene membranes by nitric acid activation and metal oxide deposition," Journal of Membrane Science 487, pp. 109-116 (2015).

Cheryan & Rajagopalan, "Membrane processing of oily streams. Wastewater treatment and waste reduction," Journal of Membrane Science 151(1), pp. 13-28 (1998).

Choi, et al., "Effects of substrate conductivity on cell morphogenesis and proliferation using tailored, atomic layer deposition-grown ZnO thin films," Scientific Reports 5, 9974, 9 pages (2015).

Dillon, et al., "Surface chemistry of $Al_2O_3$ deposition using $Al(CH_3)_3$ and $H_2O$ in a binary reaction sequence," Surface Science 322 (1-3), pp. 230-242 (1995).

Dorrer & Ruhe, "Superaerophobicity: Repellence of air bubbles from submerged, surface-engineered silicon substrates," Langmuir 28(42), pp. 14968-14973 (2012).

Dudchenko, et al., "Coupling Underwater Superoleophobic Membranes with Magnetic Pickering Emulsions for Fouling-Free Separation of Crude Oil/Water Mixtures: An Experimental and Theoretical Study," ACS Nano 9(10), pp. 9930-9941 (2015).

Elam, et al., "Conformal coating on ultrahigh-aspect-ratio nanopores of anodic alumina by atomic layer deposition," Chemistry of Materials 15(18), pp. 3507-3517 (2003).

Elam, et al., "Spatially controlled atomic layer deposition in porous materials," Applied Physics Letters 91, pp. 177-184 (2007).

Fabreguette, et al., "Quartz crystal microbalance study of tungsten atomic layer deposition using $WF_6$ and $Si_2H_6$," Thin Solid Films 488(1-2), pp. 103-110 (2005).

Fakhru'l-Razi, et al., "Review of technologies for oil and gas produced water treatment," Journal of Hazardous Materials 170(2-3), pp. 530-551 (2009).

Frackowiak & Beguin, "Carbon materials for the electrochemical storage of energy in capacitors," Carbon 39(6), pp. 937-950 (2011).

Gao, et al., "A Robust Polyionized Hydrogel with an Unprecedented Underwater Anti-Crude-Oil-Adhesion Property," Advanced Materials 28(26), pp. 5307-5314 (2016).

Ge, et al., "Pumping through Porous Hydrophobic/Oleophilic Materials: An Alternative Technology for Oil Spill Remediation," Angewandte Chemie 53(14), pp. 3612-3616 (2014).

George, "Atomic layer deposition: an overview," Chemical Reviews 110(1), pp. 111-131 (2010).

Hall, et al., "Energy storage in electrochemical capacitors: designing functional materials to improve performance," Energy & Environmental Science 3, pp. 1238-1251 (2010).

Hao, et al., "Oxygen Vacancies Lead to Loss of Domain Order, Particle Fracture, and Rapid Capacity Fade in Lithium Manganospinel ($LiMn_2O_4$) Batteries," ACS Applied Materials & Interfaces 6(14), pp. 10849-10857 (2014).

Hou, et al., "Biocatalytic Janus membranes for $CO_2$ removal utilizing carbonic anhydrase," Journal of Materials Chemistry A 3, pp. 17032-17041 (2015).

Hu, et al,. "An ultrathin bilayer membrane with asymmetric wettability for pressure responsive oil/water emulsion separation," Journal of Materials Chemistry A, 3, pp. 23477-23482 (2015).

(56) References Cited

OTHER PUBLICATIONS

International Search Report and Written Opinion for PCT/US2017/041223 dated Sep. 28, 2017, 8 pages.
Janotti & Van De Walle, "Fundamentals of zinc oxide as a semiconductor," Reports on Progress in Physics 72(12), 29 pages (2009).
Jung, et al., "Improved functionality of lithium-ion batteries enabled by atomic layer deposition on the porous microstructure of polymer separators and coating electrodes," Advanced Energy Materials 2(8), pp. 1022-1027 (2012).
Jur, et al., "Temperature-dependent subsurface growth during atomic layer deposition on polypropylene and cellulose fibers," Langmuir 26(11), pp. 8239-8244 (2010).
Keshavarz, et al., "Enhancing oil removal from water by immobilizing multi-wall carbon nanotubes on the surface of polyurethane foam," Journal of Environmental Management 157, pp. 279-286 (2015).
Kim, et al., "A development of high power activated carbon using the KOH activation of soft carbon series cokes," Transactions on Electrical and Electronic Materials 15(2), pp. 81-86 (2014).
Kota, et al., "Hygro-responsive membranes for effective oil-water separation," Nature Communications 3, 1025, 8 pages (2012).
Kota, et al., "The design and applications of superomniphobic surfaces," NPG Asia Materials 6, e109, 16 pages (2014).
Lee, et al., "An Alternative Route Towards Metal-Polymer Hybrid Materials Prepared by Vapor-Phase Processing," Advanced Functional Materials 21(16), pp. 3047-3055 (2011).
Lee, et al., "Nanofluidic transport governed by the liquid/vapour interface," Nature Nanotechnology 9, pp. 317-323 (2014).
Li, et al., "Modification of ceramic membranes for pore structure tailoring: The atomic layer deposition route," Journal of Membrane Science 397-398, pp. 17-23 (2012).
Li, et al., "Precise pore size tuning and surface modifications of polymeric membranes using the atomic layer deposition technique," Journal of Membrane Science 385-386, pp. 1-9 (2011).
Li, et al., "Under-Water Superaerophobic Pine-Shaped Pt Nanoarray Electrode for Ultrahigh-Performance Hydrogen Evolution," Advanced Functional Materials 25(11), pp. 1737-1744 (2015).
Liu, et al., "Clam's Shell Inspired High-Energy Inorganic Coatings with Underwater Low Adhesive Superoleophobicity," Advanced Materials 24(25), pp. 3401-3405 (2012).
Macdiarmid, et al., "Polyaniline: a new concept in conducting polymers," Synthetic Metals 18(1-3), pp. 285-290 (1987).
McNeill, et al., "Electronic Conduction in Polymers. I. The Chemical Structure of Polypyrrole," Australian Journal of Chemistry 16(6), pp. 1056-1075 (1963).
Ozkaya, et al., "Combined in situ XPS and UHV-chemical force microscopy (CFM) studies of the plasma induced surface oxidation of polypropylene," Plasma Processes and Polymers 11(3), pp. 256-262 (2014).
Parsons, et al., "Mechanisms and reactions during atomic layer deposition on polymers," Coordination Chemistry Reviews 257 (23-24), pp. 3323-3331 (2013).
Pasta, et al., "A Desalination Battery," Nano Letters 12(2), pp. 839-843 (2012).
Peng, et al., "Janus separator of polypropylene-supported cellular graphene framework for sulfur cathodes with high utilization in lithium-sulfur batteries," Advanced Science 3(1), pp. 1-11 (2015).
Peng, et al., "Theoretical specific capacitance based on charge storage mechanisms of conducting polymers: Comment on 'Vertically oriented arrays of polyaniline nanorods and their super electrochemical properties'," Chemical Communications 47, pp. 4105-4107 (2011).
Porada, et al., "Review on the science and technology of water desalination by capacitive deionization," Progress in Materials Science 58(8), pp. 1388-1442 (2013).
Simon & Gogotsi, "Materials for electrochemical capacitors," Nature Materials 7, pp. 845-854 (2008).
Song, et al., "Anomalous Pseudocapacitive Behavior of a Nanostructured, Mixed-Valent Manganese Oxide Film for Electrical Energy Storage," Nano Letters 12(7), pp. 3483-3490 (2012).

Steele, et al., "Inherently Superoleophobic Nanocomposite Coatings by Spray Atomization," Nano Letters 9(1), pp. 501-505 (2009).
Sugimoto, et al., "Charge storage mechanism of nanostructured anhydrous and hydrous ruthenium-based oxides," Electrochimica Acta 52(4), pp. 1742-1748 (2006).
Sugimoto, et al., "Preparation of Ruthenic Acid Nanosheets and Utilization of Its Interlayer Surface for Electrochemical Energy Storage," Angewandte Chemie International Edition 42(34), pp. 4092-4096 (2003).
Suss, et al., "Water desalination via capacitive deionization: what is it and what can we expect from it?," Energy & Environmental Science 8, pp. 2296-2319 (2015).
Tao, et al., "An Intelligent Superwetting PVDF Membrane Showing Switchable Transport Performance for Oil/Water Separation," Advanced Materials 26(18), pp. 2943-2948 (2014).
Tian, et al., "Droplet and Fluid Gating by Biomimetic Janus Membranes," Advanced Functional Materials 24(38), pp. 6023-6028 (2014).
Toupin, et al., "Charge Storage Mechanism of MnO2 Electrode Used in Aqueous Electrochemical Capacitor," Chemistry of Materials 16(16), pp. 3184-3190 (2004).
Ueda, et al., "Effects of aeration on suction pressure in a submerged membrane bioreactor," Water Research 31(3), pp. 489-494 (1997).
Vaha-Nissi, et al., "Growth of thin Al2O3 films on biaxially oriented polymer films by atomic layer deposition," Thin Solid Films 522, pp. 50-57 (2012).
Wang, et al., "Directional water-transfer through fabrics induced by asymmetric wettability," Journal of Materials Chemistry 20, 7938 (2010).
Wang, et al., "Extremely Efficient and Recyclable Absorbents for Oily Pollutants Enabled by Ultrathin-Layered Functionalization," ACS Applied Materials & Interfaces 6(21), pp. 18816-18823 (2014).
Wang, et al., "PVDF membranes with simultaneously enhanced permeability and selectivity by breaking the tradeoff effect via atomic layer deposition of TiO2," Journal of Membrane Science 442, pp. 57-64 (2013).
Wen, et al., "Zeolite-coated mesh film for efficient oil-water separation," Chemical Science 4, pp. 591-595 (2013).
Wu, et al., "Unidirectional water-penetration composite fibrous film via electrospinning," Soft Matter 8, 5996 (2012).
Xu, et al., "Atomic layer deposition of alumina on porous polytetrafluoroethylene membranes for enhanced hydrophilicity and separation performances," Journal of Membrane Science 415-416, pp. 435-443 (2012).
Xu, et al., "Hydrophilization of porous polypropylene membranes by atomic layer deposition of TiO2 for simultaneously improved permeability and selectivity," Journal of Membrane Science 448, pp. 215-222 (2013).
Xue, et al., "A Novel Superhydrophilic and Underwater Superoleophobic Hydrogel-Coated Mesh for Oil/Water Separation," Advanced Materials 23(37), pp. 4270-4273 (2011).
Yang, et al., "Mussel-inspired modification of a polymer membrane for ultra-high water permeability and oil-in-water emulsion separation," Journal of Materials Chemistry A 2, pp. 10225-10230 (2014).
Yang, et al., "Polymer membrane with a mineral coating for enhanced curling resistance and surface wettability," Chemical Communications 51, pp. 12779-12782 (2015).
Yang, et al., "Silica-Decorated Polypropylene Microfiltration Membranes with a Mussel-Inspired Intermediate Layer for Oil-in-Water Emulsion Separation," ACS Applied Materials & Interfaces 6(15), pp. 12566-12572 (2014).
Zang, et al., "Well-Aligned Cone-Shaped Nanostructure of Polypyrrole/RuO2 and Its Electrochemical Supercapacitor," The Journal of Physical Chemistry C 112(38), pp. 14843-14847 (2008).
Zhang & Barboiu, "Dynameric asymmetric membranes for directional water transport," Chemical Communications 51, pp. 15925-15927 (2015).
Zhang, et al., "Biomimetic multifunctional nanochannels based on the asymmetric wettability of heterogeneous nanowire membranes," Advanced Materials 26(7), pp. 1071-1075 (2014).
Zhang, et al., "Nanowire-Haired Inorganic Membranes with Superhydrophilicity and Underwater Ultralow Adhesive

(56) References Cited

OTHER PUBLICATIONS

Superoleophobicity for High-Efficiency Oil/Water Separation," Advanced Materials 25(30), pp. 4192-4198 (2013).

Zhang, et al., "Salt-Induced Fabrication of Superhydrophilic and Underwater Superoleophobic PAA-g-PVDF Membranes for Effective Separation of Oil-in-Water Emulsions," Angewandte Chemie International Edition 53(3), pp. 856-860 (2014).

Zhang, et al., "Superhydrophobic and Superoleophilic PVDF Membranes for Effective Separation of Water-in-Oil Emulsions with High Flux," Advanced Materials 25(14), pp. 2071-2076 (2013).

Zheng & Yapa, "Bouyant Velocity of Spherical and Nonspherical Bubbles/Droplets," Journal of Hydraulic Engineering 126(11), pp. 852-854 (2000).

Zhou, et al., "Superphobicity/philicity janus fabrics with switchable, spontaneous, directional transport ability to water and oil fluids," Sci. Rep., 3, pp. 1-6 (2013).

Afshar & Cadien, "Growth mechanism of atomic layer deposition of zinc oxide: A density functional theory approach," Applied Physics Letters 103(25), 251906, 6 pages. (2013).

Kowalik, et al., "Extra-Low Temperature Growth of ZnO by Atomic Layer Deposition with Diethylzinc Precursor," Acta Physica Polonica A 112(2), pp. 401-406 (2007).

\* cited by examiner

OLEOPHILIC FOAMS FOR OIL SPILL MITIGATION

CROSS-REFERENCE TO RELATED APPLICATIONS

This application is a divisional and claims the benefit of and priority to U.S. patent application Ser. No. 14/967,021, filed Dec. 11, 2015, the content of which is incorporated by reference herein in its entirety.

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to oleophilic materials and methods of forming the same.

BACKGROUND

Oil spills are a major environmental hazard. Particularly, oil spills in water bodies cause billions of dollars in losses, which includes cost of lost oil, environmental remediation after oil spills, losses to businesses in coastal areas and legal costs to name a few. For example, it is estimated that the 1979 Ixtoc 1 oil spill cost about $1.3 Billion, the 1989 Exxon Valdez oil spill cost about $6.3 Billion, and the most recent Deepwater Horizon oil spill cost over $47 Billion. Effective remediation has the potential to dramatically reduce these costs. Various technologies are used for recovering surface oil spills, that is, oil floating on the surface of a water body. These include for example skimming, which is a slow and tedious process, burning, which has significant environmental consequences itself, and dispersing using chemical dispersants, which can be toxic to aquatic life and does not directly eliminate the oil but rather causes it to submerge as droplets.

Beyond oil on the water surface, a significant portion of the spilled oil can be submerged below the surface of the water body. This can be due to a sub-surface oil source as is often the case in oil spills emanating from offshore rigging accidents. This can also occur following treatment with dispersants or simply as a result of oil components with density greater than that of the water in which the spill occurs. There does not exist a reliable technology for removing and recovering submerged oil, particularly submerged oil from water columns of fast moving water located in riverine or near shore environments in depths of up to two hundred feet.

SUMMARY

Embodiments described herein relate generally to oleophilic foams and methods for forming such foams and, in particular to forming oleophilic foams using atomic layer deposition (ALD), molecular layer deposition (MLD) and/or sequential infiltration synthesis (SIS) processes.

In some embodiments, a method of fabricating an oleophilic foam includes providing a foam comprising a base material. The base material is coated with an inorganic material using at least one of an ALD, MLD or an SIS process. The at least one of the ALD, MLD or the SIS process includes at least one cycle of exposing the foam to a first metal precursor for a first predetermined time and a first partial pressure. The first metal precursor deposits onto or infiltrates into at least a portion of the base material and binds with the base material. The foam is exposed to a second co-reactant precursor for a second predetermined time and a second partial pressure. The second co-reactant precursor reacts with the first metal precursor, thereby forming the inorganic material on the base material. The inorganic material grows on or infiltrates at least a portion of the base material. The inorganic material is functionalized with an oleophilic material.

In some embodiments, an oleophilic foam includes a base material. An inorganic material is coated on the base material such that the inorganic material is deposited on or infiltrates at least a portion of the base material. An oleophilic material is coupled to the inorganic material.

In some embodiments, a method of cleaning oil spills located on or beneath the surface of a water body includes providing a foam. The foam includes a base material coated with an inorganic material. The inorganic material is deposited on or infiltrates at least a portion of the base material. The inorganic material is functionalized with an oleophilic material. The foam is lowered to a depth in the water body corresponding to a location of the oil spill. The foam is dragged through the oil spill or the water current is allowed to drag the oil spill through the foam such that the oleophilic material causes the foam to reversibly absorb the oil.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
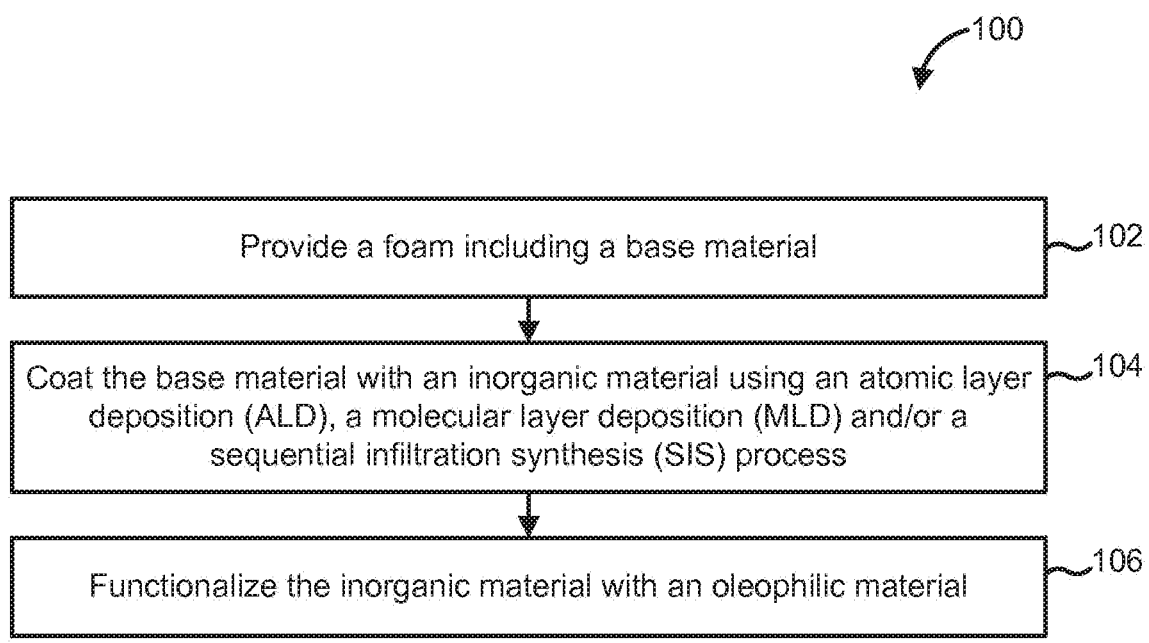
FIG. 1 is a schematic flow diagram of a method for fabricating an oleophilic foam, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to oleophilic foams and methods for forming such foams and, in particular to forming oleophilic foams using an atomic layer deposition (ALD) and/or sequential infiltration synthesis (SIS) process.

Oil spills are a major environmental hazard and result in losses of billions of dollars. Particularly there is a dearth of technologies for removing and recovering oil from surface and submerged oil spills. Some materials such as silica aerogels, organoclays, zeolites and carbonaceous materials are sometimes used to remove surface and submerged oil. However, these materials have numerous drawbacks. For example, these materials have low absorption capacity, are not reusable, are expensive, have poor mechanical stability and the removed oil cannot easily be recovered.

In contrast, embodiments of the oleophilic foam described herein and method of forming the same may provide benefits, for example: (1) having high oleophilicity; (2) providing high oil uptake rate and capacity; (3) using non-toxic materials for the foam such that there is no health hazard for persons deploying the oleophilic foam or native marine life; (4) high stability allowing use in fresh or sea water at various temperatures; (5) using cheap readily available commercial foams to form the oleophilic foam, thereby having low cost; (6) capability of absorbing oil droplets or dissolved oil from surface or submerged oil spills; (7) allowing recovery of collected oil by simply squeezing the foam; and (8) reusing the foam once the collected oil is removed.

FIG. 1 is a schematic flow diagram of a method 100 for forming an oleophilic foam according to an embodiment. The oleophilic foam formed using the method 100 can be used for collecting and recovering oil from oil spills, for example surface oil spills or submerged oil spills.

The method 100 includes providing a foam comprising a base material at 102. The base material can include any suitable material such as, for example polyurethane, polyimides, acrylics, polyamides, polyesters, polycarbonates, polyaramides, or any other suitable base material which can be used to form the foam. In some embodiments, the base material is formed from a polymer which includes one or more carbonyl moieties within some or all of the monomers of the polymer. In particular embodiments, the base material includes polyurethane. In some embodiments, the foam can include a plurality of strands of the base material intermingled, interwoven or otherwise shaped so as to form the foam, for example a foam block, a foam net, a foam pad or any other suitable structure.

The base material is coated with an inorganic material using an ALD, an MLD and/or a sequential infiltration synthesis (SIS) process at 104. The ALD, MLD and/or SIS process may include exposing the foam to a first metal precursor for a first predetermined time and a first partial pressure of the first metal precursor so that the metal precursor deposits on, coats or infiltrates at least a portion of the base material (e.g., infiltrates beneath the surface of each of the plurality of strands 310 forming the base material shown in FIG. 3) and binds with the base material. The first predetermined time can be in the range of 1 second to 500 seconds (e.g., 1, 5, 10, 20, 30, 40, 50, 60, 70, 80, 90, 100, 120, 140, 160, 180, 200, 220, 240, 260, 280, 300, 350, 400, 450 or 500 seconds inclusive of all ranges and values therebetween). In some embodiments, the first predetermined time is in the range of 1 and 10 seconds, for example about 5 seconds. The first partial pressure of the first metal precursor can be in the range of 0.01 Torr to 10 Torr. (e.g., 0.01, 0.05, 0.1, 0.5, 1.0, 5.0, 10 Torr inclusive of all ranges and values therebetween). In some embodiments, the first partial pressure of the first metal precursor is in the range of 0.1 Torr and 1 Torr, for example about 0.5 Torr.

In some embodiments, the base material can be heated to a predetermined temperature during the ALD, MLD and/or SIS process. For example, the first predetermined temperature can be in the range of 50-200 degrees Celsius (e.g., 50, 60, 70, 80, 90, 100, 110, 120, 130, 140, 150, 160, 170, 180, 190 or 200 degrees Celsius inclusive of all ranges and values therebetween). In some embodiments, the predetermined temperature is in the range of 70-90 degrees Celsius, for example 85 degrees Celsius. In some embodiments, the first predetermined temperature can be in the range of 120-140 degrees Celsius, for example 135 degrees Celsius.

In some embodiments, the first metal precursor includes Trimethyl Aluminum (TMA), Triethyl Aluminum (TEA), Yttrium Tris(2,2,6,6-Tetramethyl-3,5-Heptanedionate) $(Y(thd)_3)$, Diethyl Zinc (DEZ), Titanium tetrachloride $(TiCl_4)$, Vanadium (V) Oxytriisopropoxide (VOTP), Palladium (II) hexafluoroacetylacetonate, $(Pd(hfac)_2)$, copper bis (2,2, 6, 6-tetramethy 1-3, 5-heptanedionate) $(Cu(thd)_2)$, copper(II) hexafluoroacetylacetonate hydrate $(Cu(hfac)_2)$, iron tris(2,2,6,6-tetramethyl-3,5-heptanedionate) $(Fe(thd)_3)$, cobalt tris(2,2,6,6-tetramethyl-3,5-heptanedionate) $(Co(thd)_3)$, Bis(2,2,6,6-tetramethyl-3,5-heptanedionato) barium triglyme adduct $(Ba(thd)_2.tri)$, Bis(cyclopentadienyl) ruthenium $(Ru(cp)_2)$, disilane $(Si_2H_6)$, Tungsten Hexafluoride $(WF_6)$, Bis(N,N'diisopropylacetamidinato) copper(I) (Cu(DIA)), Nickel (II) acetylacetonate $(Ni(acac)_2)$, antimony pentachloride $(SbCl_5)$, niobium pentachloride $(NbCl_5)$, niobium pentethoxide $(Nb(OEt)_5)$, titanium isopropoxide $(Ti(iOPr)_4)$, tris(tetramethylcyclopentadienyl) cerium (III), cyclopentadienyl indium (InCp), tris(i-propylcyclopentadienyl) lanthanum $(La (iPrCp)_3)$, bis (cyclopentadienyl) magnesium $(Mg(Cp)_2)$, bis (cyclopentadienyl) nickel $(NiCp_2)$, (trimethyl)methylcyclopentadienylplatinum (IV) $(Pt(MeCp)Me_3)$, bis (pentamethylcyclopentadienyl) strontium $(Sr(Me_5Cp)_2)$, tris (cyclopentadienyl) yttrium $(YCp_3)$, bis(cyclopentadienyl) dimethylzirconium $(ZrCp_2Me_2)$, bis(methylcyclopentadienyl) methoxymethyl zirconium (ZrOMe), tetrakis(dimethylamino) tin (TDMASn), tetrakis(dimethylamino) zirconium (TDMAZr), tris(dimethylamino) aluminum (TDMAAl), iridium(III) acetylacetonate $(Ir(acac)_3)$, niobium pentafluoride (NbF$_5$), ferrocene (FeCp$_2$), cyclohexadiene iron tricarbonyl (FeHD(CO)$_3$), tetrakis(dimethylamino) antimony (TDMASb), aluminum trichloride (AlCl$_3$), niobium (V) iodide (NbI$_5$), tin (IV) iodide (SnI$_4$), Tris (tetramethylcyclopentadienyl) gadolinium(III) (Gd(Me4Cp)$_3$), Bis(pentamethylcyclopentadienyl) barium 1,2-dimethoxyethane adduct (Ba (Me$_5$Cp)-2-DMA), Molybdenum Hexafluoride (MoF$_6$), Tris (tert-pentoxy)silanol (TTPSi), Silicon tetrachloride (SiCl$_4$), lithium tert-butoxide (Li(tOBu)), trimethyl indium (TMin), trimethyl gallium (TMGa), and dimethyl cadmium (TMCd), or any combination thereof.

The foam is then exposed to a second co-reactant precursor for a second predetermined time and a second partial pressure of the second co-reactant such that the second co-reactant precursor reacts with the first metal precursor to form the inorganic material on or within the base material. In some embodiments, the second co-reactant precursor includes water, hydrogen peroxide, nitrous oxide, oxygen, ozone, hydrogen, formaldehyde, trimethyl aluminum, ammonia, hydrazine, dimethyl hydrazine, diethyl hydrazine, methyl-ethyl hydrazine, hydrogen sulfide, trimethyl phosphite, trimethyl phosphate, silane, disilane, or any combination thereof. For example, the first metal precursor can be trimethyl aluminum and the second co-reactant can be water. The second predetermined time can be in the range of 1 to 500 seconds (e.g., 1, 5, 10, 20, 30, 40, 50, 60, 70, 80, 90, 100, 120, 140, 160, 180, 200, 220, 240, 260, 280, 300, 350, 400, 450 or 500 seconds inclusive of all ranges and values therebetween). In some embodiments, the second predetermined time is in the range of 1 and 10 seconds, for example about 5 seconds. The second partial pressure of the second co-reactant can be in the range of 0.01 Torr to 10 Torr. (e.g., 0.01, 0.05, 0.1, 0.5, 1.0, 5.0, 10 Torr inclusive of all ranges and values therebetween). In some embodiments, the partial pressure of the second co-reactant is in the range of 0.1 Torr and 1 Torr, for example about 0.5 Torr.

Any number of cycles of exposing the foam to the first metal precursor and the second co-reactant precursor can be performed to reach a desired thickness of the inorganic material film, or depth within the polymer strand (e.g., the polymer strand of the base material 312) that the inorganic material has infiltrated. In some embodiments, the number of cycles of the ALD, MLD and/or SIS process can be in the range of 1-50, for example 1 cycle, 2, 3, 4, 5, 10, 15, 20, 25, 30, 35, 40, 45 or 50 cycles inclusive of all ranges and values therebetween. In some embodiments, 1 to 5 cycles of the ALD, MLD and/or SIS process are used to form a desired thickness of the inorganic material on the base material.

In some embodiments, the inorganic material formed on the base material and deposited on or infiltrating at least the portion of the base material includes a metal, a metal oxide, a metal nitride, a metal sulfide, metal chalcogenide, a metal carbide, a metal phosphide, or any combination thereof. For example, the inorganic material can include Al$_2$O$_3$, TiO$_2$, ZnO, MgO, SiO$_2$, HfO$_2$, ZrO$_2$, W or any combination thereof. In some embodiments, the first metal precursor includes TMA and the second co-reactant precursor includes water or ozone. In such embodiments, the inorganic material coated on and infiltrating at least a portion of the base material includes Al$_2$O$_3$.

Expanding further, SIS is related to ALD. MLD is similar to ALD but instead of atoms being deposited layer by layer as in ALD, molecules are deposited layer by layer on the substrate. In general, the SIS process involves exposing a substrate (e.g., the base material) which can be formed from an organic material to various gas phase precursors (e.g., the first metal precursor and the second co-reactant precursor) to synthesize the inorganic material, similar to ALD. However, contrary to ALD which only forms the inorganic material on a surface of the substrate, SIS coats the surface of the substrate but also infiltrates into the bulk substrate. This is achieved by adjusting the partial pressure and time of the gas phase precursor exposures (i.e., the first metal precursor and the second co-reactant precursor).

In some embodiments, the SIS process may include relatively long periods of gas phase exposure and high partial pressure of the first metal precursor and the second co-reactant precursor. For example, the SIS method may include a relatively long period of gas phase exposure and high partial pressure of the first metal precursor followed by a long period of exposure and high partial pressure of the second co-reactant precursor. In various embodiments, a purging step can be performed in-between exposure to the first metal precursor and the second co-reactant precursor.

For example, the base material can be positioned in a hermetically sealed chamber pumped to vacuum. The base material is exposed to the first metal precursor for the first predetermined time (e.g., between 1 second and 500 seconds) and the first partial pressure (e.g., between 0.01 and 10 Torr). The chamber is then evacuated, and/or purged with an inert gas, for example nitrogen, argon, or any other inert gas before exposing the base material to the second co-reactant component. In another embodiment, the method may include a series of short pulses of the first metal precursor followed by another series of short pulses of the second co-reactant precursor. In some embodiments, a series of short pulses may be combined with long periods of gas phase exposure to the first metal precursor and/or the second co-reactant precursor.

In some embodiments, the total time of exposure to first metal precursor and/or the second co-reactant precursor during SIS cycle may be 5 to 1000 times higher and the partial pressures may be 5-10,000 larger than the typical time and partial pressure for an ALD cycle.

The first metal precursor infiltrates within the base material and selectively binds (either covalently or non-covalently) to a functional group of the base material, for example a carbonyl group. The second co-reactant precursor is selectively reactive with the first metal precursor that is bound to the base material. For example, the first reactive gas may be a ligated metal such as trimethyl aluminum (TMA) and the second reactive gas may be water. In some embodiments, a third precursor may be used.

The SIS process results in the growth of the inorganic material on the surface of the base material and also in a sub-surface region of the base material associated with the first metal precursor and the second co-reactant precursor used. In some embodiments, the inorganic material can form an inorganic layer that may have a thickness in the range of 0.2 nm to 5,000 nm. For example, the inorganic material can include aluminum oxide (Al$_2$O$_3$), which may be formed on the base material surface using TMA as the first metal precursor and water as the second co-reactant precursor. In other embodiments, the inorganic material can infiltrate the base material via SIS so as to infuse the base material polymer with the inorganic material (e.g. Al$_2$O$_3$) to a depth of 0.05 micron to 1,000 microns.

In some embodiments, the base material forming the foam includes polyurethane, having the chemical structure shown below:

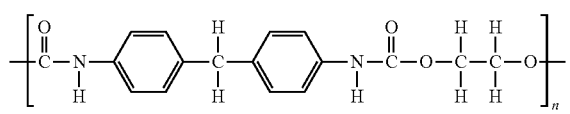

During the first phase of the ALD or SIS process, the polyurethane is exposed to TMA as the first metal precursor which reacts with the carbonyl moieties in the polyurethane as shown by the following reaction:

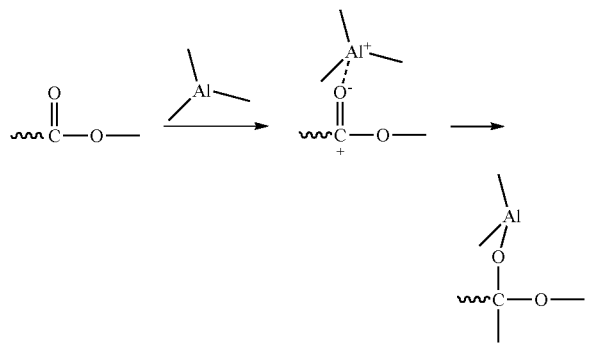

During the second phase of the ALD, MLD or SIS process, the second co-reactant precursor, for example water reacts with the first precursor coupled to the carbonyl bonds of the polyurethane to form $Al_2O_3$ on the polyurethane. The $Al_2O_3$ or any other inorganic material deposited on the base material serves as a linker for coupling of an oleophilic material thereto, as described herein.

In some embodiments, the first metal precursor (e.g., TMA) selectively binds with carbonyl moieties present in the base substrate. In other embodiments, any other polymer component or reactive functional groups of the base material may be utilized for selective inorganic material. For example, the first metal precursor may be formulated to interact with various functional groups of the base material through various interactions, including metal-ligand coordination, covalent bonding, and other interactions. For example, in various embodiments the base material may include pyridine groups, which can be used to selectively bind various metal compounds including $Al(CH_3)_3$, $AlCl_3$, $ZnCl_2$, $CdCl_2$, etc., which may be used as the first metal precursor. In some embodiments, the base material can include hydroxyl groups, which can react with various first metal precursors, including $Al(CH3)_3$, $TiCl_4$, $Zn(C_2H_5)_2$, etc. to form covalent bonds.

Two components may be significant in driving the ALD, MLD or SIS process to obtain particular characteristics of the inorganic material formed on the base material. The first component is the selective and self-limited reaction of the first metal precursor such as TMA, $TiCl_4$, $SnCl_4$, $AlCl_3$, $Al(CH_3)_3$, etc., which are Lewis acids in this example, and the second component is the second co-reactant precursor strategically selected functional moieties in the base material such as the carbonyl groups in polyurethane. Once bound to the polymer, the grafted metal-ligands serve as nucleation sites for the second co-reactant precursor. Within each of these components, the reactions are controllable on the molecular level and the characteristic self-limited heterogeneous reactions provide macroscopic uniformity.

In various embodiments, the second co-reactant precursor may be an oxygen source (e.g., $H_2O$, $O_2$, $O_3$, $H_2O_2$, etc.), a reducing agent (e.g., $H_2$, hydrazine, $Si_2H_6$, etc.), or other compound reactive with the first metal precursor. The order of the precursors may be altered in various embodiments. For instance, in some embodiments the second co-reactant precursor (e.g., $H_2O$, $H_2S$) can be selected to react with or bind to a specific functional group in the base material and utilized first in the ALD, MLD and/or SIS sequence, and the first metal precursor can be utilized next in the ALD, MLD and/or SIS sequence so as to react with the adsorbed or bound second co-reactant precursor.

The inorganic material is functionalized with an oleophilic material at 106, thereby forming the oleophilic foam. The oleophilic material can include any material that has a high affinity for oils. In some embodiments, the oleophilic material can include a silane, for example, 3-(trimethoxysilyl)propylmethacrylate, heptadecafluorodecyltrimethoxysilane, octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, octadecyltrichlorosilane, methyltrimethoxysilane, nonafluorohexyltrimethoxysilane, vinyltriethoxysilane, ethyltrimethoxysilane, propyltrimethoxysilane, trifluoropropyltrimethoxysilane, 3-(2-aminoethyl)-aminopropyltrimethoxysilane, p-tolyltrimethoxysilane, cyanoethyltrimethoxysilane, aminopropyltriethoxysilane, phenyltrimethoxysilane, chloropropyltrimethoxysilane, mercaptopropyltrimethoxysilane, glycidoxypropyltrimethoxysilane, acetoxyethyltris(dimethylamino)silane, n-decyltri s(dimethylamino)silane, 7-octenyltrimethoxysilane, 7-octenylthrichlorosilane, γ-methacryloxypropyltrimethoxysilane, (3-glycidyloxypropyl)trimethoxysilane, 3-(trimethoxysilyl)propyl acrylate, isooctyl trimethoxysilane, butyldimethyl(dimethylamino)silane, trimethoxy(7-octen-1-yl)silane, 3-(trichlorosilyl)propyl methacrylate, 2-(trichlorosilyl)ethyl acetate, any other silane, any other oleophilic material or any combination thereof.

The base material can be exposed to the oleophilic material using any suitable method. In some embodiments, the oleophilic material is deposited using a liquid phase method, for example by immersing the foam comprising the base material coated with the inorganic material in the liquid oleophilic material (e.g., a silane) or in a liquid solution of the oleophilic material dissolved in a solvent (e.g. ethanol). In some embodiments, the foam can be exposed to a vapor of the oleophilic material (e.g., a vapor of a volatile silane). For example, the foam coated with or infiltrated with the inorganic material can be functionalized with the oleophilic material using a single-step vapor phase process.

In some embodiments, an ALD process can be used to coat the foam with the oleophilic material. For example, the foam including the base material (e.g., polyurethane) coated with an inorganic material (e.g., $Al_2O_3$) is subjected to one or more ALD cycles comprised of an exposure to the oleophilic material (e.g., 3-(trimethoxysilyl)propylmethacrylate) optionally followed by an exposure to a co-reactant (e.g. water). The oleophilic material, for example a silane, can covalently or non-covalently react with the inorganic material, for example a metal or metal oxide, so that the inorganic material is functionalized with the oleophilic material.

Figure 3A:
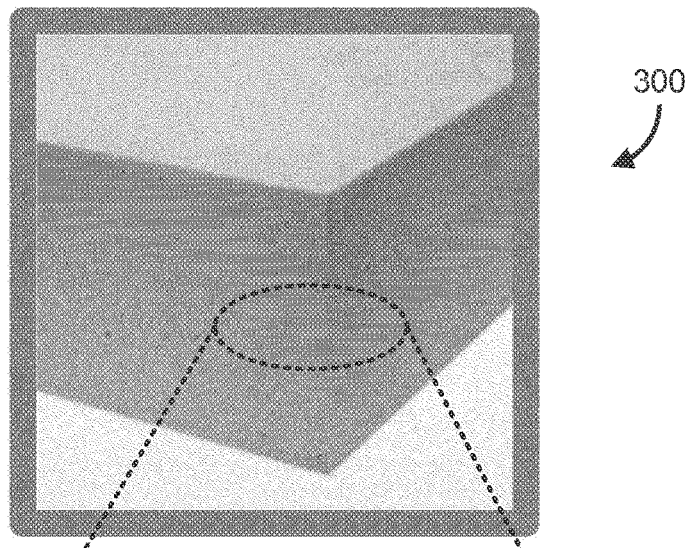
FIG. 3A is an image of a portion of a block of an oleophilic foam.
Figure 3B:
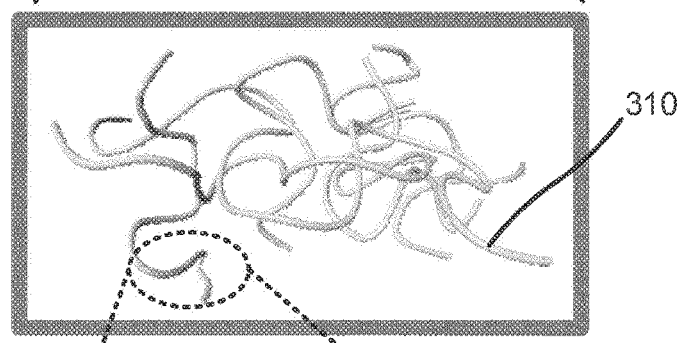
FIG. 3B is an enlarged schematic view of a portion of the block of oleophilic foam of FIG. 3A showing a plurality of strands of the oleophilic foam included therein.
Figure 3C:
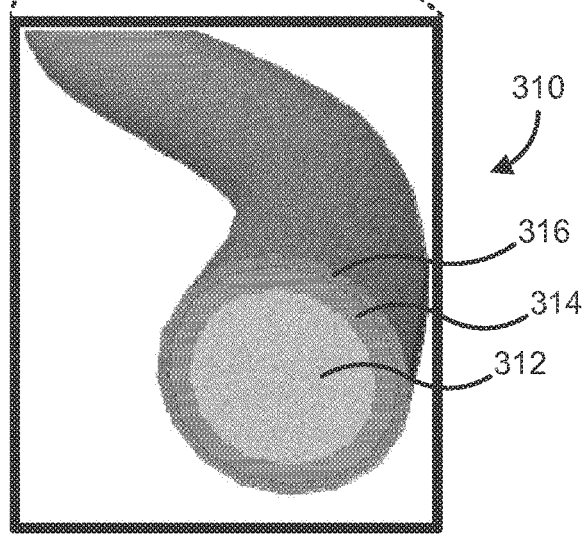
FIG. 3C is an enlarged cross-section schematic view of the a single strand of the plurality of strands of the oleophilic foam of FIG. 3B.

In this manner, an oleophilic foam having a high capacity and affinity for oils and low affinity for water is formed. FIG. 3A is an optical image of a block 300 of an oleophilic foam formed using an embodiment of the method 100. FIG. 3B is an enlarged schematic view of a portion of the block 300 showing a plurality of strands 310 of the oleophilic foam interwoven together or shaped to form the block 300 of the oleophilic foam. FIG. 3C shows an enlarged cross-section schematic view of a single strand 310 of the plurality of strands 310 forming the block 300 of the oleophilic foam.

As shown in FIG. 3C, each strand 310 of the oleophilic foam includes a base material 312 (e.g., polyurethane or any other base material described herein). The base material 312 is coated with an inorganic material 314 (e.g., $Al_2O_3$ or any other inorganic material described herein) using the ALD or SIS process described with respect to the method 100 such that the inorganic material deposits on or infiltrates at least a portion of the base material 312 (e.g., infiltrates 0.01 to 1000 microns into the surface of the base material). The inorganic material is functionalized with the oleophilic material (e.g., a silane) rendering the block of foam highly oleophilic as well as hydrophobic.

In various embodiments, the block 300 of oleophilic foam provides 45× w/w oil absorption or even higher. Furthermore, the oil absorption properties of the block 300 of the oleophilic foam can be 10× higher than carbon foams. The block 300 of the oleophilic foam 300 is non-toxic and therefore can be used without significant health concerns to the personnel deploying the foam, the environment or the marine life.

While the oleophilic foam 300 is generally described as being used for mitigating oil spills the oleophilic foam 300 can be used for any other purpose or use. For example, the oleophilic foam can be used as a filter for removing oils or other oily materials from a fluid over extended periods of time (e.g., as filter for removing oil in water supplies, filtering lipids from biological samples, etc.).

Figure 2:
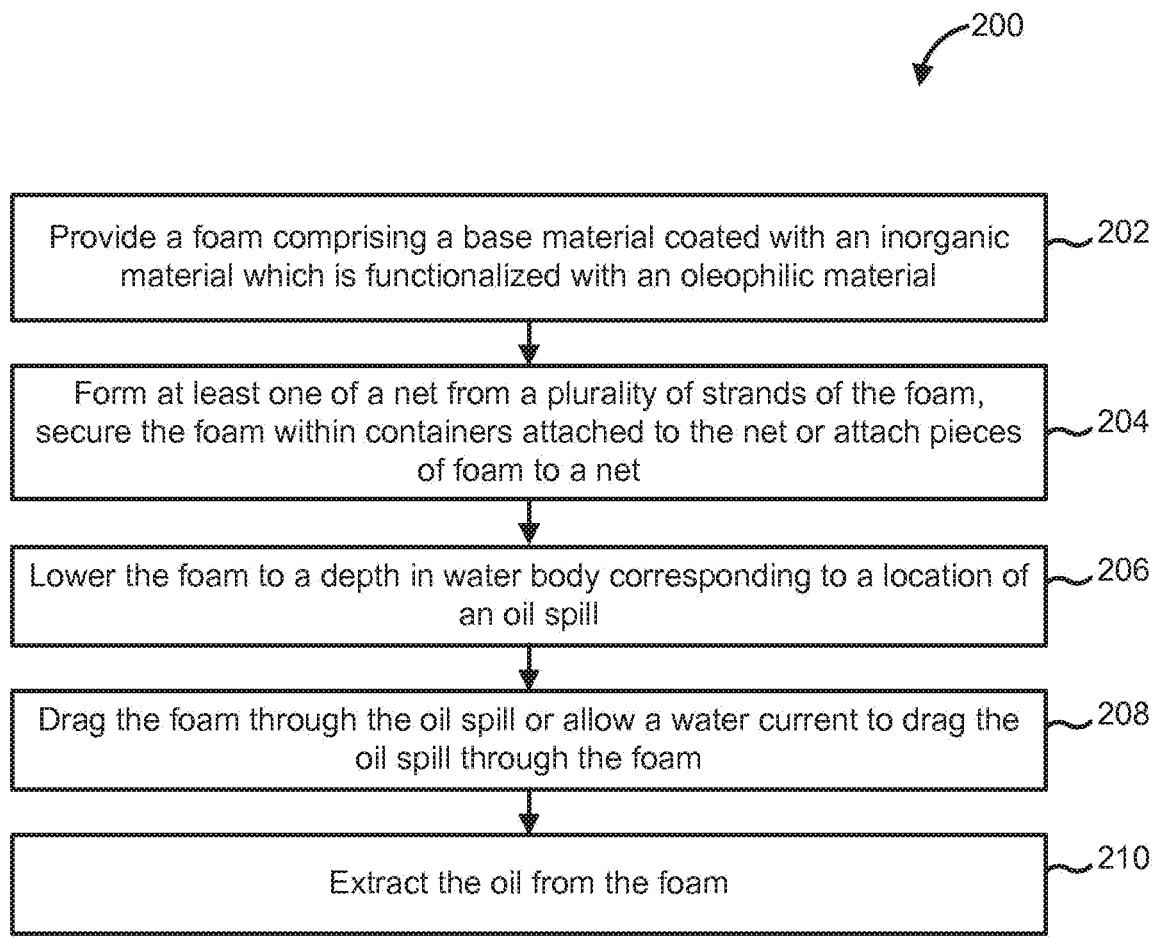
FIG. 2 is a schematic flow diagram of another embodiment of a method for removing submerged oil from an oil spill using an oleophilic foam.

FIG. 2 is a schematic flow diagram of an embodiment of a method 200 for cleaning and recovering oil from oil spills located on or beneath the surface of a water body, for example an ocean, a lake or a river. The method 200 includes providing an oleophilic foam at 202. The oleophilic foam comprises a base material, for example polyurethane or any other base material described herein. The base material is coated with an inorganic material, for example $Al_2O_3$ or any other inorganic material described herein which is deposited on or infiltrates the base material. The inorganic material can be coated on the base material using the ALD, MLD and/or SIS process described herein and using any first metal precursor (e.g., TMA) and second co-reactant precursor (e.g., water) as described in detail with respect to the method 100. The inorganic material is functionalized with an oleophilic material, for example a silane or any other oleophilic material described in detail herein.

Figure 4:
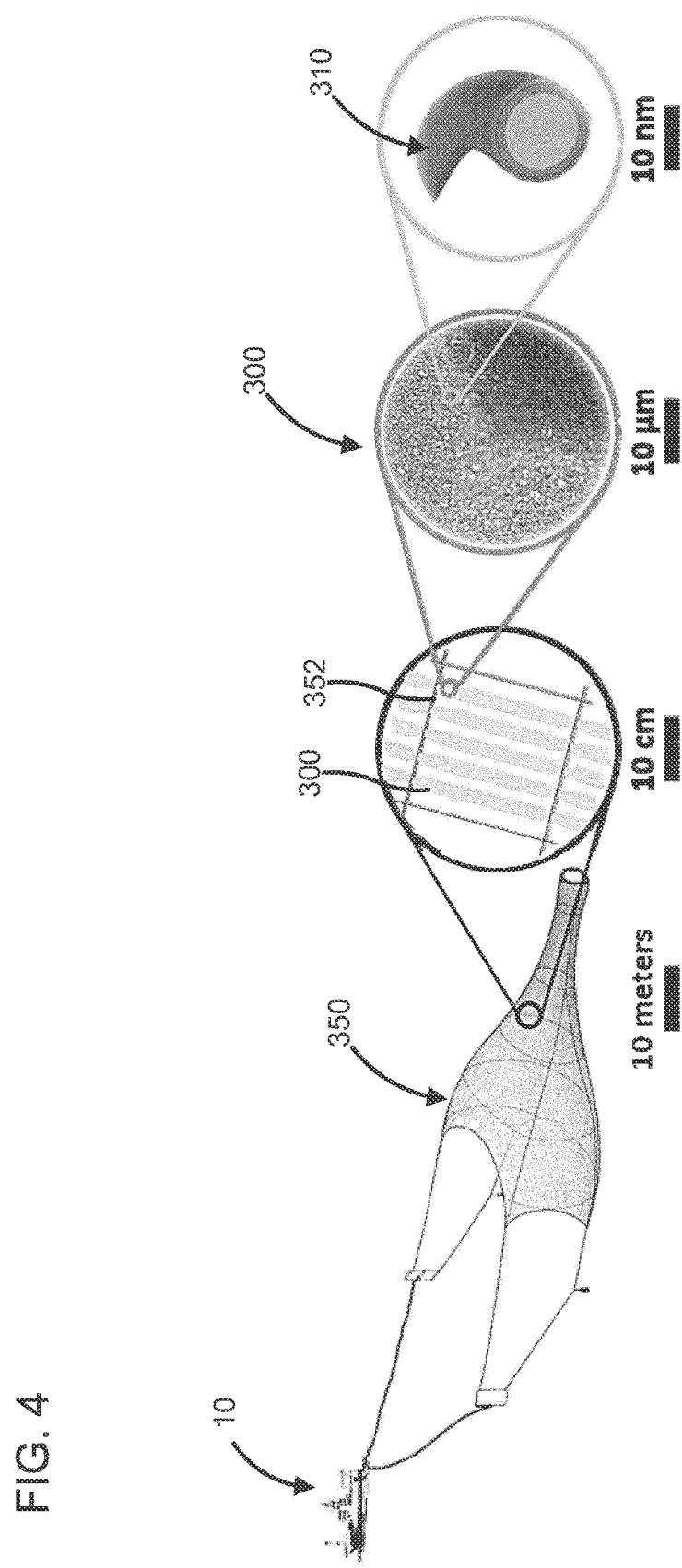
FIG. 4 shows one embodiment of an apparatus for removing oil from oil spills submerged in water bodies using a net to which the oleophilic foam of FIG. 3 is attached.

In some embodiments, the oleophilic foam can be integrated with a net at 204. For example, a plurality of strands of the oleophilic foam can be interwoven to form a net (e.g., the net 350 formed from a plurality of strands of the oleophilic foam 300 as shown in FIG. 4). In some embodiments, the foam may be enclosed within mesh bags or other porous containers and attached to a net. In some embodiments, pieces of the foam may be attached to a net.

The oleophilic foam is lowered into a depth in the water body corresponding to a location of the oil spill at 206. For example, the net functionalized with strands of the oleophilic foam can be lowered to the depth corresponding to the location of the oil spill. In some embodiments in which the oil spill is a surface oil spill, the oleophilic foam can be shaped into a block or pad. In such embodiments, the block or pad of the oleophilic foam is positioned on the surface of the water body.

The oleophilic foam is dragged through the oil spill at 208 (or the water current carries the oil past and through the foam). For example, the net formed from the strands of the oleophilic foam is dragged through the submerged oil spill or the block of the oleophilic foam is dragged through the surface oil spill. The oleophilic material included in the oleophilic foam causes the oleophilic foam to reversibly absorb the oil.

In some embodiments, the oleophilic foam is compressed so as to remove the oil absorbed in the oleophilic foam so that the oleophilic foam is reusable thereafter 210. For example, once net or block of the oleophilic foam has absorbed oil to its capacity, the net or block of the foam is removed from the water body and squeezed (e.g., between rollers) to remove the oil absorbed by the oleophilic foam. The removed oil can be collected and used or disposed of in an environmentally benign fashion.

FIG. 4 shows illustrations of a system for removing oil from a water body using an oleophilic foam. A net 350 formed from an oleophilic foam or having oleophilic foam coupled thereto is attached (e.g., suspended) from a marine vehicle 10, for example, a ship or a trawler. The net 350 includes a plurality of strands of the oleophilic foam 300, as described herein. The strands of the oleophilic foam 300 can be secured between a plurality of second strands 352 of a strong, rigid and corrosion resistant material. For example, the plurality of second strands 352 can be formed from nylon, Kevlar, carbon fiber, or a metal such as stainless steel, aluminum, any other suitable material or a combination thereof. The net 350 is immersed to a depth corresponding to a location of the oil spill. The net 350 is dragged through the oil spill by the marine vehicle 10 such that the net 350 absorbs the oil. Once the net 350 has absorbed the oil to capacity, the net 350 is drawn out of the ocean. The net 350 can be then be squeezed, for example between rollers to draw out and collect the oil.

The following section provides various examples of the oil absorbing capabilities of various oleophilic foams formed using the methods described herein. These examples are for illustration purposes only and are not intended to limit the disclosure.

EXAMPLES

Figure 5:
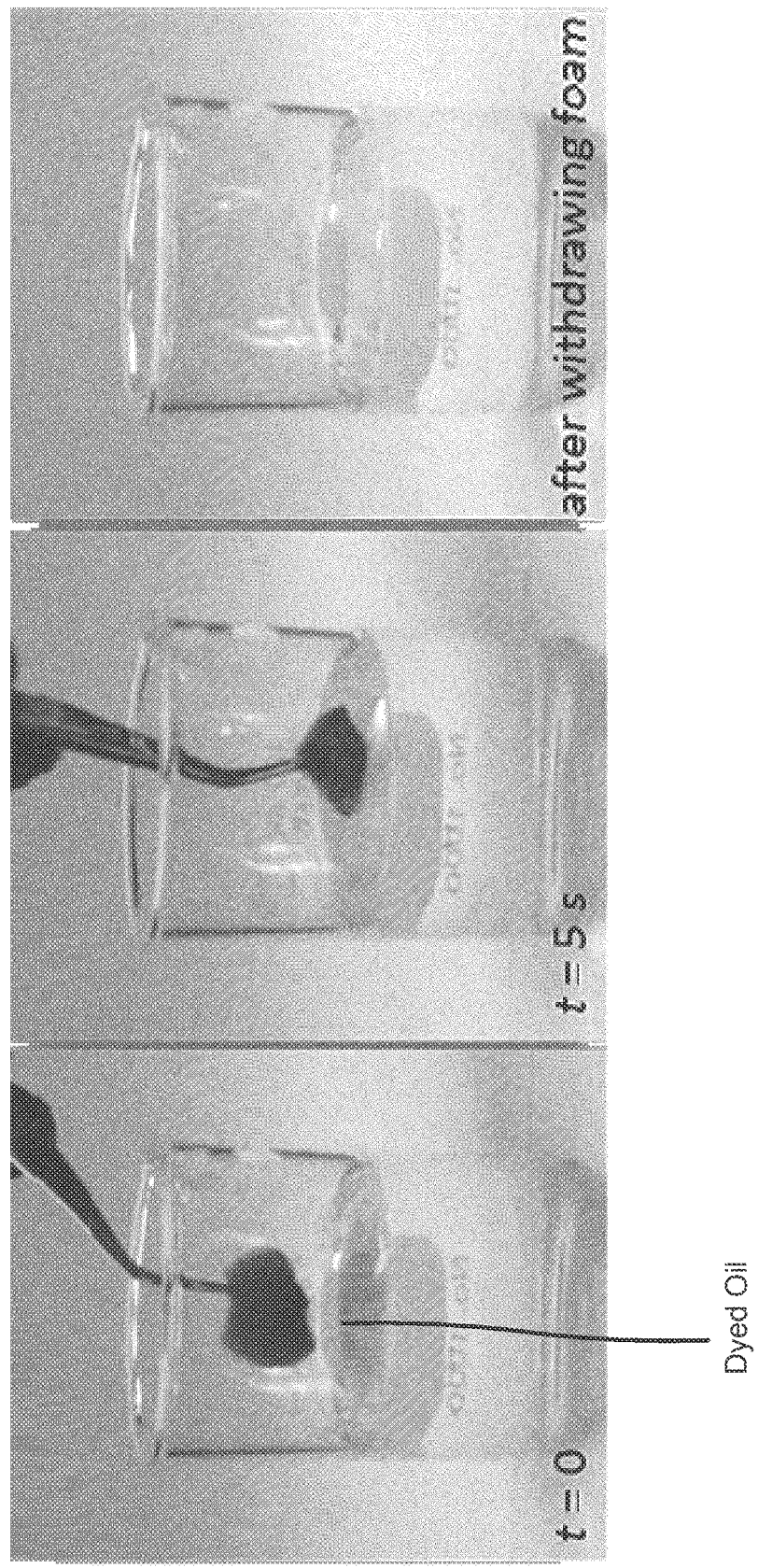
FIG. 5A is an image of a beaker containing water with dyed oil floating thereon.
FIG. 5B is an image of the beaker of water of FIG. 5A after immersing an oleophilic foam therein which absorbs all the oil within 5 seconds.
FIG. 5C is an image of the beaker of FIG. 5A after all the oil has been absorbed by the oleophilic foam.

FIG. 5A-C is an image of a beaker containing water with dyed oil floating thereon. An oleophilic foam which includes a pad of polyurethane foam coated with $Al_2O_3$ using an SIS process and functionalized with 3-(trimethoxysilyl)propylmethacrylate, according to the methods described herein is immersed in the water. FIG. 5B is an image of the beaker of water of FIG. 5A after immersing the oleophilic foam therein. The oleophilic foam absorbs all the oil within 5 seconds. FIG. 5C is an image of the beaker of FIG. 5A after all the oil has been absorbed by the oleophilic foam leaving substantially clean water in the beaker.

Figure 6:
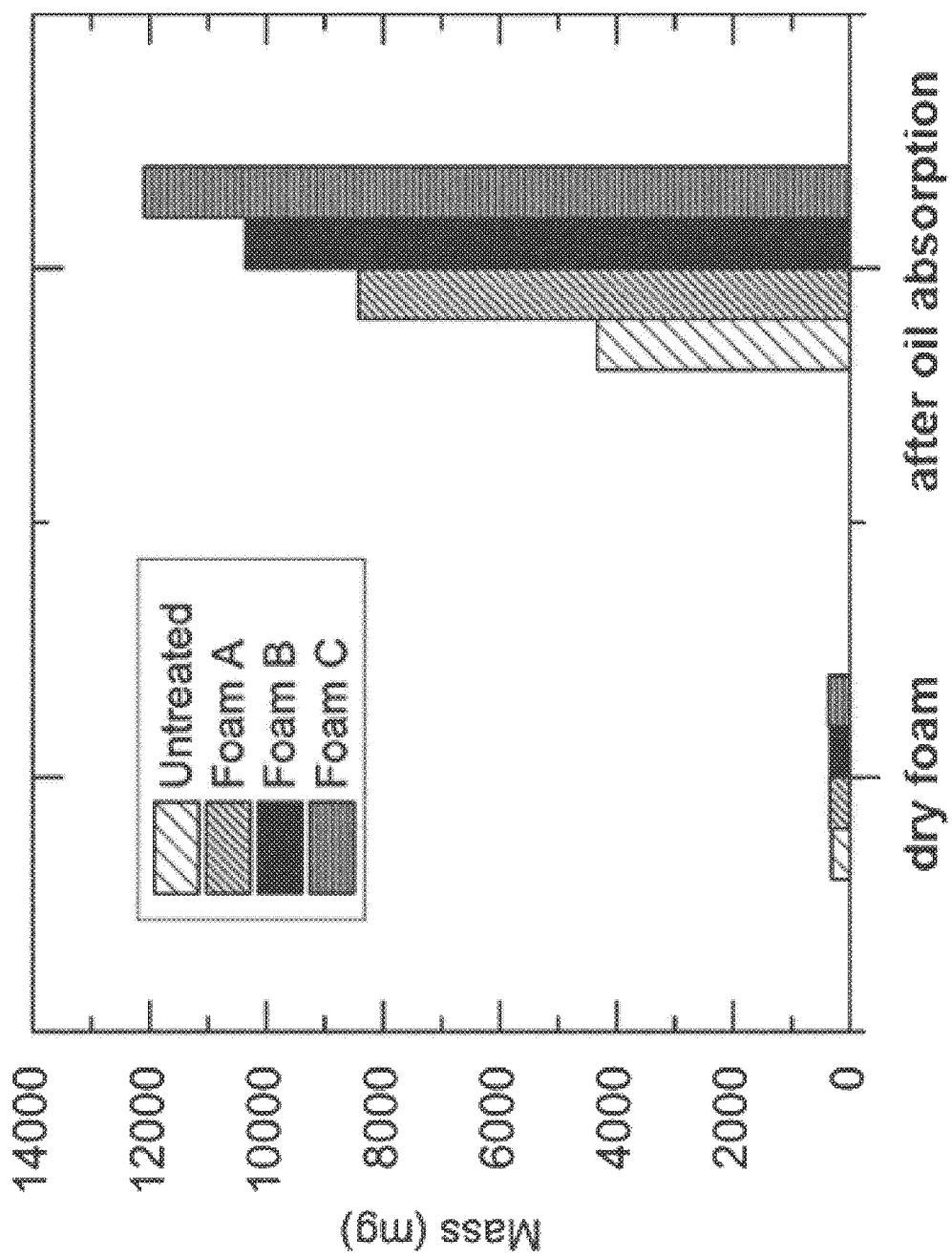
FIG. 6 is a bar chart illustrating the oil absorbing capability of various oleophilic foams relative to an untreated foam.

FIG. 6 is a bar chart of oil absorption capabilities of three oleophilic foams Foam A, Foam B and Foam C relative to an untreated foam. Each of the untreated foam, and Foams A, B and C include a polyurethane foam and have the same size and mass. Each of the Foams A, B and C are formed using the SIS process described herein such that the Foam C is functionalized with the highest amount of oleophilic material, followed by Foam B and Foam A. As seen in FIG. 6, the untreated foam absorbs about 4,000 grams oil within a predetermined time. In contrast, Foam A absorbs about 9,000 grams, Foam B absorbs about 11,000 grams and Foam C absorbs about 13,000 grams of the oil within the same predetermined time.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present disclosure.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method of fabricating an oleophilic foam, comprising;
    providing a foam comprising a plurality of strands of a base material interconnected to form the foam such that the foam comprises a skeleton formed by the plurality of strands, the skeleton forming a porous region therebetween;
    infiltrating the plurality of strands of the base material with an inorganic material using a sequential infiltration synthesis (SIS) process, the SIS process including at least one cycle of:
        exposing the foam to a first metal precursor for a first predetermined time and a first partial pressure, the first metal precursor coating the skeleton as well as infiltrating a predetermined depth below a surface of each of the plurality of strands forming the skeleton and binding with the base material, and
        exposing the foam to a second co-reactant precursor for a second predetermined time and a second partial pressure, the second co-reactant precursor reacting with the first metal precursor, thereby forming the inorganic material on the base material, the inorganic material growing on and infiltrating the plurality of strands forming the skeleton to the predetermined depth; and
    functionalizing the inorganic material with an oleophilic material,
    wherein the predetermined depth to which the inorganic material infiltrates below a surface of each of the plurality of strands forming the skeleton is in a range of 0.01 microns to 1,000 microns, such that the oleophilic foam provides at least 20× w/w oil absorption.

2. The method of claim 1, wherein the base material includes at least one of polyurethane, polyimides, acrylics, polyamides, polyesters, polycarbonates, or polyaramides.

3. The method of claim 1, wherein the first metal precursor comprises at least one of Trimethyl Aluminum (TMA), triethyl aluminum (TEA), Yttrium Tris(2,2,6,6-Tetramethyl-3,5-Heptanedionate) (Y(thd)$_3$), Diethyl Zinc (DEZ), Titanium tetrachloride (TiCl$_4$), Vanadium (V) Oxytriisopropoxide (VOTP), Palladium (II) hexafluoroacetylacetonate, (Pd (hfac)$_2$), copper bis(2,2, 6, 6-tetramethy 1-3, 5-heptanedionate) (Cu(thd)$_2$), copper(II) hexafluoroacetylacetonate hydrate (Cu(hfac)$_2$), iron tris(2,2,6,6-tetramethyl-3,5-heptanedionate) (Fe(thd)$_3$), cobalt tris(2,2,6,6-tetramethyl-3,5-heptanedionate) (Co(thd)$_3$), Bis(2,2,6,6-tetramethyl-3,5-heptanedionato)barium triglyme adduct (Ba (thd)$_2$.tri), Bis(cyclopentadienyl) ruthenium (Ru(cp)$_2$), disilane (Si$_2$H$_6$), Tungsten Hexafluoride (WF$_6$), Bis(N,N'-diisopropylacetamidinato)copper(I) (Cu(DIA)), Nickel (II) acetylacetonate (Ni(acac)$_2$), antimony pentachloride (SbCl$_5$), niobium pentachloride (NbCl$_5$), niobium pentethoxide (Nb(OEt)$_5$), titanium isopropoxide (Ti(iOPr)$_4$), tris(tetramethylcyclopentadienyl) cerium (III), cyclopentadienyl indium (InCp), tris(i-propylcyclopentadienyl) lanthanum (La (iPrCp)$_3$), bis(cyclopentadienyl) magnesium (Mg (Cp)$_2$), bis (cyclopentadienyl) nickel (NiCp$_2$), (trimethyl) methylcyclopentadienylplatinum (IV) (Pt(MeCp)Me$_3$), bis (pentamethylcyclopentadienyl) strontium (Sr(Me$_5$Cp)$_2$), tris (cyclopentadienyl) yttrium (YCp$_3$), bis(cyclopentadienyl) la dimethylzirconium (ZrCp$_2$Me$_2$), bis(methylcyclopentadienyl) methoxymethyl zirconium (ZrOMe), tetrakis(dimethylamino) tin (TDMASn), tetrakis(dimethylamino) zirconium (TDMAZr), tris(dimethylamino) aluminum (TDMAAl), iridium(III) acetylacetonate (Ir(acac)$_3$), niobium pentafluoride (NbF$_5$), ferrocene (FeCp$_2$), cyclohexadiene iron tricarbonyl (FeHD(CO)$_3$), tetrakis(dimethylamino) antimony (TDMASb), aluminum trichloride (AlCl$_3$), niobium (V) iodide (NbI$_5$), tin (IV) iodide (SnI$_4$), Tris (tetramethylcyclopentadienyl) gadolinium(III) (Gd(Me4Cp)$_3$), Bis(pentamethylcyclopentadienyl) barium 1,2-dimethoxyethane adduct (Ba (Me$_5$Cp)-2-DMA), Molybdenum Hexafluoride (MoF$_6$), Tris (tert-pentoxy)silanol (TTPSi), silicon tetrachloride (SiCl$_4$), lithium tert-butoxide (Li(tOBu)), trimethyl indium (TMin), trimethyl gallium (TMGa), and dimethyl cadmium (TMCd).

4. The method of claim 1, wherein the second co-reactant precursor comprises at least one of water, hydrogen peroxide, nitrous oxide, oxygen, ozone, hydrogen, formaldehyde, trimethyl aluminum, ammonia, hydrazine, dimethyl hydrazine, diethyl hydrazine, methyl-ethyl hydrazine, hydrogen sulfide, trimethyl phosphite, trimethyl phosphate, silane, and disilane.

5. The method of claim 1, wherein the inorganic material includes at least one of a metal, a metal oxide, a metal nitride, a metal sulfide, metal chalcogenide, a metal carbide or a metal phosphide.

6. The method of claim 5, wherein the inorganic material includes at least one of Al$_2$O$_3$, TiO$_2$, ZnO, MgO, SiO$_2$, HfO$_2$, ZrO$_2$, Al(CH$_3$)$_3$, AlCl$_3$, TiCl$_4$, Zn(C$_2$H$_5$)$_2$ or W.

7. The method of claim 1, wherein the functionalizing is performed using a single-step vapor phase process.

8. The method of claim 1, wherein the functionalizing is performed using a liquid-phase functionalization process.

9. The method of claim 1, wherein the oleophilic material includes a silane.

10. The method of claim 1, wherein the plurality of strands of the base material are shaped so as to form a block or a pad.

11. The method of claim 1, wherein the plurality of strands of the base material are interwoven so as to form a net.

12. The method of claim 1, wherein the first partial pressure of the first metal precursor is in a range of 0.01 Torr to 10 Torr.

13. The method of claim 1, further comprising heating the base material to a temperature in a range of 50 degrees Celsius to 200 degrees Celsius.

14. The method of claim 1, wherein the second partial pressure of the second co-reactant precursor is in a range of 0.01 Torr to 1 Torr.

\* \* \* \* \*